United States Patent
Cripe

(10) Patent No.: US 7,622,918 B2
(45) Date of Patent: *Nov. 24, 2009

(54) SOLENOID MAGENTOMETER

(75) Inventor: David W. Cripe, Williamsburg, VA (US)

(73) Assignee: Continental Automotive Systems US, Inc., Auburn Hills ( * ) Notice: Subject to any disclaimer, the term of this patent is extended or adjusted under 35 U.S.C. 154(b) by 0 days.

This patent is subject to a terminal disclaimer.

(21) Appl. No.: 11/234,462

(22) Filed: Sep. 23, 2005

(65) Prior Publication Data
US 2007/0069723 A1 Mar. 29, 2007

(51) Int. Cl.
G01L 3/02 (2006.01)
G01R 33/04 (2006.01)
G01B 7/16 (2006.01)

(52) U.S. Cl. .................. 324/253; 73/862.331
(58) Field of Classification Search ..................
73/862.331–862.333, 862.335–862.336; 324/253
See application file for complete search history.

(56) References Cited

U.S. PATENT DOCUMENTS

| 5,351,555 | A | 10/1994 | Garshelis |
| 5,696,575 | A | 12/1997 | Kohnen et al. |
| 5,889,215 | A | 3/1999 | Kilmartin et al. |
| 5,939,881 | A | 8/1999 | Slater et al. |
| 6,145,387 | A | 11/2000 | Garshelis |
| 6,222,363 | B1 | 4/2001 | Cripe |
| 6,237,428 | B1 | 5/2001 | Odachi et al. |
| 6,298,467 | B1 | 10/2001 | Chuang et al. |
| 6,300,855 | B1 | 10/2001 | Clark et al. |
| 6,346,812 | B1 | 2/2002 | May et al. |
| 6,516,508 | B1 | 2/2003 | Gandarillas |
| 6,553,847 | B2 | 4/2003 | Garshelis |
| 6,698,299 | B2 * | 3/2004 | Cripe ............ 73/862.331 |
| 6,823,746 | B2 * | 11/2004 | Viola et al. ........ 73/862.335 |
| 7,320,255 | B2 * | 1/2008 | Cripe ............ 73/862.331 |
| 2002/0162403 | A1 | 11/2002 | Cripe |
| 2007/0034021 | A1 * | 2/2007 | Cripe ............ 73/862.331 |

FOREIGN PATENT DOCUMENTS

| DE | 3887853 | 5/1994 |
| DE | 10331128 | 1/2004 |
| EP | 1752750 | 2/2007 |
| EP | 1752751 | 2/2007 |
| EP | 1752752 | 2/2007 |

* cited by examiner

Primary Examiner—Reena Aurora

(57) ABSTRACT

A magnetometer assembly (22) for a torque transducer (10) includes inner and outer coils (34,38,36,40) wrapped and supported on a bobbin assembly (22). The bobbin assembly (22) includes upper and lower axial portions (21,23) divided by a middle flange (28). The middle flange (28) includes a plurality of notches (32) that are disposed equal angularly about an axis (18). A plurality of corresponding magnetic strips (42) extend axially through each of the notches (32) and through the entire length of the magnetometer assembly (22). The magnetic strips (42) are disposed between an inner and outer coil assembly (34,38,36,40) and becomes saturated in the presence of a magnetic field. Divergent magnetic fields created by torque applied to a torque transducer element (12) disposed within the magnetometer assembly (22) and detected and measured to provide an indication of applied torque.

10 Claims, 2 Drawing Sheets

US 7,622,918 B2

SOLENOID MAGENTOMETER

BACKGROUND OF THE INVENTION

This invention generally relates to a magnetometer for a torque sensor. More particularly, this invention relates to a magnetometer including several coils disposed relative to each for measuring torque related divergent magnetic fields.

Conventional torque sensors include a torque transducer element that responds to the application of torque by generating a magnetic field. Such generated or changed magnetic fields are detected by a magnetometer. The torque transducer element typically includes a magnetoelastic material that responds to the application of torque by generating a magnetic field. The application of torque to the magnetoelastic material creates shear stresses within the magnetized regions causing the direction of the magnet field generated by the torque transducer element to shift from a substantially circumferential direction to a helical direction. The helical shifting of the magnetic field is detected as an axial component of the magnetic field. The axial component of the magnetic field is proportional to the applied torque and provides an accurate and reliable indication of torque applied to a torque element.

Sensing of the magnetic field and specifically the axial components of the distortions in the magnetic field caused by torque is accomplished through the use of magnetic field sensors. A commonly used type of magnetic field sensors is a flux gate sensor, which is fabricated as a coil of fine wire surrounding a core of magnetically-saturable material, and is supplied with an alternating current. The alternating current provides for the periodic magnetic saturation of magnetic elements. The magnetic field produced by the torque transducer shaft is superimposed on the periodic magnetic field generated by the coils. The superimposing the magnetic field produced by the torque transducer shaft creates an asymmetry in the magnetic saturation of the coils. Changes in the inductance of the coils due to the magnetic saturation results in a voltage that is induced to the coils. It is this voltage that is measured to determine the amplitude and direction of torque applied to the torque transducer element.

A known prior art magnetic field sensor includes a bobbin having an upper and lower axial section provided by a central flange. The upper and lower coils are isolated from each other and are induced with an alternating current to produce a magnetic field. Magnetically saturatable strips are disposed between the coil and the torque transducer element. These magnetic strips are magnetically saturated by the alternating current that is produced within the coils. The magnetic strips are disposing parallel to the shaft and the axis of rotation. The magnetic strips are fabricated from a material that possesses a very abrupt magnetic saturation characteristic, meaning that the magnetic strips are quickly saturatable in the presence of a magnetic field and in the absence of the magnetic field quickly demagnetize.

Disadvantageously prior art magnetic field sensors require precise alignment to eliminate distortion caused by impinging magnetic fields. The required specific and precise alignment increases cost and complexity and reduces durability and dependability of the torque sensor.

Accordingly, it is desirable to design and develop a durable easy to produce and accurate magnetic field sensor that is compatible with torque transducer elements having a shaft supporting a magnetoelastic material.

SUMMARY OF THE INVENTION

An example magnetometer according to this invention includes first and second inner coils that are supported on a common bobbin and that are both connected to first and second outer coil. Between the inner and outer coils is a plurality of magnetic strips. The magnetic strips are alternately magnetized and demagnetized to produce a magnetic field that is utilized to measure distortion caused by torque applied to a torque transducer element.

The magnetometer assembly according to this invention includes a bobbin that is divided into an upper axial portion and a lower axial portion. The upper and low axial portions are divided by a middle flange. Each axial portion includes an inner coil and an outer coil. The inner coil and outer coils are electrically connected. The inner and outer coils are wound in such a manner as to produce correspondingly opposing and equal magnetic fields.

Between the inner and outer coils is a plurality of magnetic strips. Each of the magnetic strips is magnetically saturatable and includes a very high length to diameter ratio that extends axially the length of the upper and lower coils. The middle flange may include a corresponding plurality of notches to allow the magnetic strips to extend the entire length of the bobbin.

A magnetic field is produced by an alternating current energizing the coils to periodically saturate the magnetic strips at the positive and negative peaks of the alternating waveform. When a torque is applied to the torque transducer element, a divergent magnetic field is created. The divergent magnetic field is superimposed on the magnetic strips in a different manner in the upper and lower portions of the magnetometer assembly. Each of the upper and lower coils is in electrical communication with a central node. Voltage at the central node is observed and is indicative of a difference in magnitude and amplitude of the magnetic field between the upper and lower coils and is in turn indicative of torque applied to the shaft.

Accordingly, the magnetometer of this invention provides for the simple efficient and economic sensing of magnetic fields produced by a torque transducer element in a simple and cost effective bobbin assembly.

These and other features of the present invention can be best understood from the following specification and drawings, the following of which is a brief description.

DETAILED DESCRIPTION OF THE PREFERRED EMBODIMENT

Figure 1:
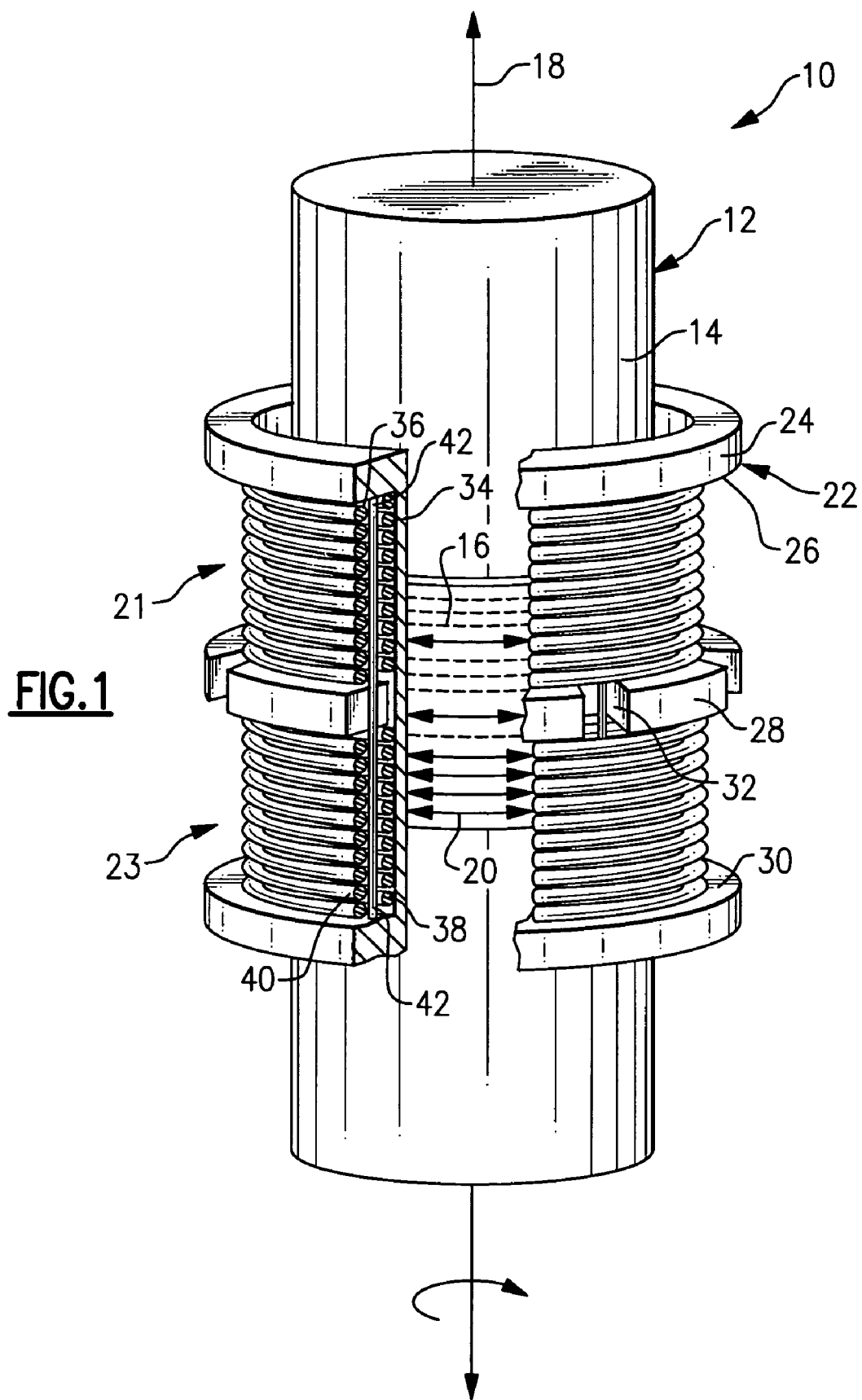
FIG. 1 is a partial cut away view of a portion of an example torque sensor according to this invention.

Referring to FIG. 1, a torque sensor assembly 10 according to this invention is illustrated and includes a torque transducer element 12 that supports a magnetoelastic ring 16. The torque transducer element 12 includes the shaft 14 that supports the magnetoelastic ring 16. The torque transducer element 12 is rotatable about an axis 18. Torque within the torque transducer element 12 is transmitted to the magnetoelastic ring 16. The magnetoelastic ring 16 possesses a magnetic field along a circumferential magnetic easy direction indicated by arrows 20 when in a default non-torqued condition.

Figure 3:
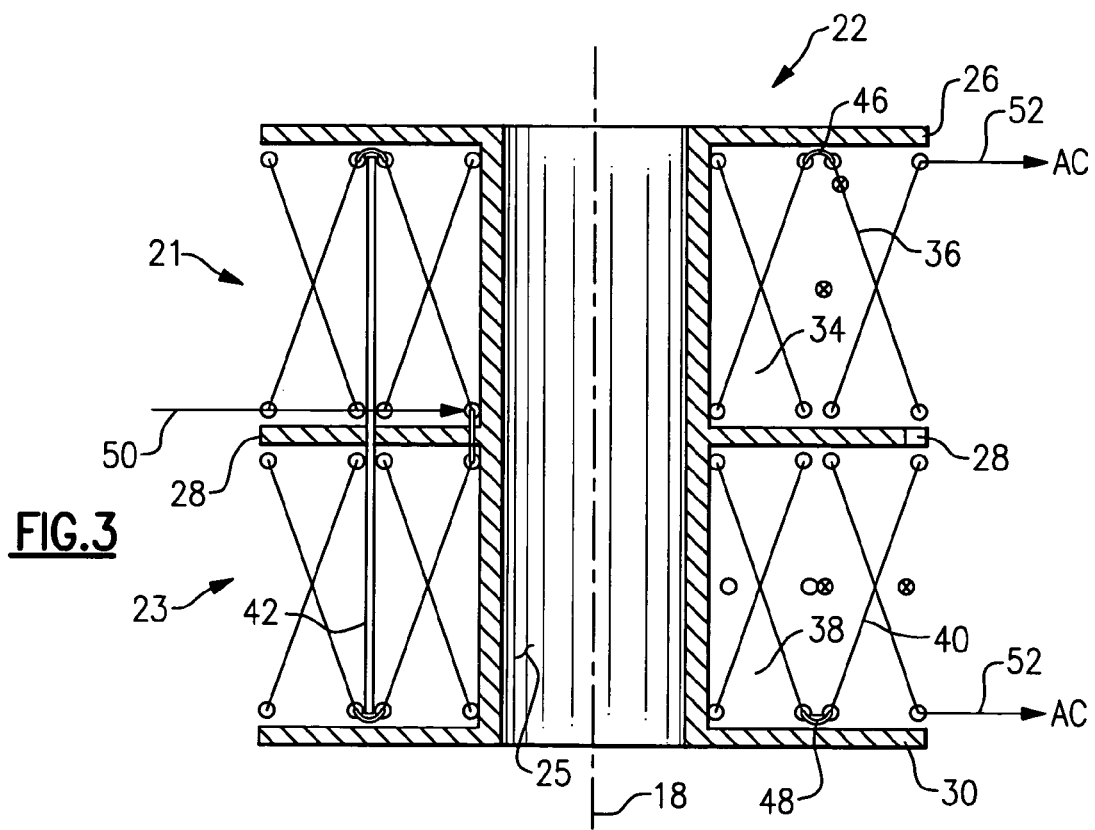
FIG. 3 is a schematic cross-sectional view of an example magnetometer according to this invention.

The torque sensor assembly 10 includes a magnetometer 22. The magnetometer 22 comprises a bobbin 24 that has an upper axial portion 21 and a lower axial portion 23 that are separated by a middle flange 28. Each of the upper and lower portions 21,23 includes an inner coil and an outer coil. The upper portion 21 includes the inner coil 34 and the outer coil 36. The lower portion 23 includes an inner coil 38 and an outer coil 40. The inner coils 34 and 38 are electrically connected at a central node 50 (FIG. 3). Further, each of the inner coils 34, 38 are electrically connected to the outer coils 36, 40. Disposed between each of the inner coils 34, 38 and outer coils 36, 40 are a plurality of axially orientated magnetic strips 42.

The magnetic strips 42 are disposed axially along the length of the bobbin 24. The magnetic strips 42 are preferably wires or strips that have an extremely large length to diameter ratio.

The inner coils 34 and 38 produce a magnetic field in the presence of an alternating current that is opposite to a magnetic field that is produced by the outer coils 36, 40. The oppositely produced magnetic fields of the inner coils 34, 38 and outer coils 36, 40 provides for a desired low inductance that could not otherwise be created with individual coils.

Each of the inner coils 34, 38 and outer coils 36, 40 are wound utilizing approximately 200 turns of magnet wire. The specific size of the magnet wire and number of turns utilized to produces the coils is application specific and a worker skilled in the art would understand how to size such a coil to provide the desired magnetic properties for a specific application. In the example illustrated in FIG. 1 each of the inner and outer coils 34,38,36,40 posses approximately 200 windings. Further, the inner coils 34,38 are disposed radially proximate to the shaft 14 of the transducer element 12. It is desirable to locate the inner coils 34,38 in close relationship with the torque transducer element 12 in order to provide desired accuracy and sensing of any magnetic field distortions produced by torque applied to the torque transducer element 12.

Further, no matter how many turns are provided for producing and configuring each of the inner coils 34, 38 and outer coils 36, 40 each of the coils will have an equal number of turns. The advantage of this means of construction is that the equal number of turns and the utilization of a single bobbin by which to support those turns reduces complexity and increases durability.

Figure 2:
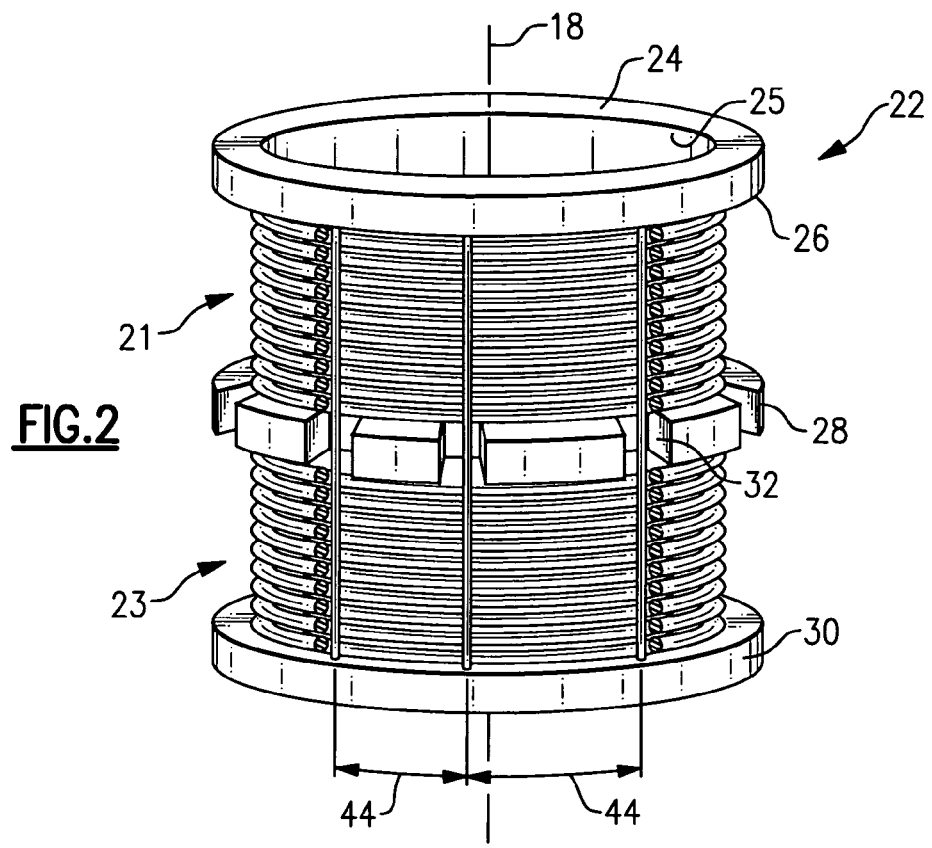
FIG. 2 is a perspective view of an example magnetometer according to this invention.

Referring to FIG. 2, the magnetometer assembly 22 is illustrated in a perspective view without the torque transducer 12 and includes the plurality of magnetic strips 42 that are disposed equal angularly about the bobbin 24. The equal angular distribution of the magnetic strips provides a uniform magnetic saturation for each of the magnetic strips 42. This equal angular distribution is facilitated by a corresponding plurality of equally angular distributed notches 32 in the middle flange 28. As appreciated, the specific number and spacing of the magnetic strips 42 is application sensitive. The number of magnetic strips 42 provides a means of tailoring a desired sensitivity that may be adjusted by changing the number and spacing between each of the magnetic strips 42.

FIG. 2 illustrates equal angular distribution and spacing between each of the magnetic strips 42. The spacing between magnetic strips 42 is indicated by the radial lengths 44 that are disposed such that each of the magnetic strips 42 are positioned parallel to the axis 18.

Referring to FIG. 3, the magnetometer assembly 22 is shown schematically in cross-section to illustrate the various electrical connections between the coils and their relationship to the magnetic strips 42 disposed there between. Referring to the upper portion 21 of the bobbin 26, the inner coil assembly 34 is electrically connected to the outer coil assembly 36. However, each of the inner coil assemblies 34 and outer coil assemblies 36 are wound in such a manner as to produce magnetic fields of opposite orientation. Further, each of the upper coil assemblies 34, 36 are produced with an exact, identical number of winding to produce magnetic fields of equal magnitude.

Referring now to the lower portion 23 of the magnetometer assembly 22, the lower inner coil assembly 38 is electrically connected to the outer coil assembly 40. The electrical connection is shown as node 48. Again, the inner coil 38 and outer coil 40 are fabricating utilizing identical sizes and grades of wire with identical numbers of turns. The inner coil 38 and outer coil 40 produce a magnetic field of equal but opposite orientations.

Disposed between the inner and outer coil assemblies 34,38,36,40 of both the upper portion 21 and lower portion 23 of the magnetometer assembly 22 are the magnetic strips 42.

The coils 34, 36, 38, 40 are attached to an alternating current source as is indicated at 52. The alternating current source 52 provides an alternating current utilized to produce a periodic saturation of the magnetic strips 42. The alternating current is produced by application of a square voltage waveform to produce positive and negative peaks at which the magnetic strips 42 become magnetically saturated.

Referring now to FIGS. 1 and 3, in operation, the coils 34,36,38,40 generate a magnetic field onto which is superimposed the magnetic field generated by the torque transducer element 12. The magnetic field generated by the torque transducer element 12 is divergent in nature and will be detected differently at different axial portions of the magnetic strips 28. As the magnetic field within the upper and lower portions 21, 23 of the magnetometer 22 are equal; a different saturation in the magnetic strips 42 within the upper and lower portions 21,23 of the magnetometer assembly 22 will be detected as a voltage at a common node 50.

Accordingly, at the common node or connection point 50 between the upper and lower portions 21,23 of the magnetometer assembly 22 a pulse voltage wave form with a frequency different than that being utilized to drive the coils will be detected. The phase and amplitude of the voltage signal generated and detected at the node 50 is indicative and related to the amplitude and the direction of the divergent magnetic field and thereby the torque applied to the torque transducer element 12.

Accordingly, in operation each of the coils 34, 36, 38, 40 are excited by the alternating current at amplitude that creates saturation in the magnetic strips 42. Each of the magnetic strips 42 is saturated magnetically at the positive and negative peaks of the alternating current waveform. When torque is applied to the torque transducer element 12 a divergent magnetic field by the magnetoelastic ring 16 is superimposed upon the magnetic field produced within the magnetic strips 42. This superimposed imposition of the magnetic field onto the magnetically saturated strips 42 produces an asymmetry in the magnetic saturation between the upper and lower portions 21,23 of the magnetometer 22. The voltage waveform produced by the asymmetry can be observed at the common node 50 and will comprise an even ordered harmonic. The even ordered harmonics of the voltage waveform includes a frequency and a phase along with equally utilized characteristics to determine the amplitude of the magnetic field and thereby the torque applied to the torque transducer element 12.

Accordingly, the magnetometer 22 developed and described in this invention provides for the accurate and durable measurement of a magnetic field produced by the torque transducer element 12 utilizing a bobbin and common coil winding techniques.

Although a preferred embodiment of this invention has been disclosed, a worker of ordinary skill in this art would recognize that certain modifications would come within the scope of this invention. For that reason, the following claims should be studied to determine the true scope and content of this invention.

What is claimed is:

1. A magnetometer assembly comprising:
    a first inner coil and a first outer coil disposed coaxially and electrically connected to one another;
    a second inner coil and as second outer coil disposed coaxially with said second inner coil and electrically connected to one another;
    a plurality of circumferentially spaced apart magnetic strips disposed parallel to said axis between said at least one inner coil and said at least one outer coil, wherein each of the plurality of magnetic strips is separated from each other and intermittently spaced about the axis wherein each of the plurality of metal strips extends the axial length between the first inner and outer coils to the second inner and outer coils.

2. The assembly as recited in claim 1, including a bobbin onto which said first inner coil, said first outer coil, said second inner coil and said second outer coil are wound.

3. The assembly as recited in claim 2, including a distinct axial subdivision separating said first inner and outer coils from said second inner and outer coils.

4. The assembly as recited in claim 3, wherein the axial subdivision comprise a flange including a plurality of slots through which extends a corresponding one of the plurality of metal strips.

5. The assembly as recited in claim 1, wherein said plurality of magnetic strips comprise a plurality of individual wires having a length much greater than a cross-sectional area.

6. The assembly as recited in claim 1, wherein said inner and outer coils are adapted to coaxially encircle a magnetic region of a magnetoelastic device.

7. A magnetometer assembly comprising:
    an first coil including a first outer coil disposed concentrically about a first inner coil;
    a second coil including a second outer coil disposed concentrically about a second inner coil, wherein said first coil and said second coil are disposed about a common axis and separated axially; and
    a plurality of wires each extending parallel to the common axis and extending axially between the first outer coil and the first inner coil and the second outer coil and the second inner coil, wherein the plurality of wires are intermittently spaced about the common axis.

8. The assembly as recited in claim 7, wherein each of the plurality of wires extends the entire axially distance between the first coil and the second coil.

9. The assembly as recited in claim 7, wherein the plurality of wires are spaced circumferentially apart from each other.

10. The assembly as recited in claim 7, including a bobbin supporting the first coil and the second coil, the bobbin includes a flange axially separating the first coil from the second coil, wherein the flange includes a plurality of slots corresponding with the plurality of wires extending axially between the first coil and the second coil.

\* \* \* \* \*